United States Patent
Kluge et al.

(10) Patent No.: US 7,085,548 B1
(45) Date of Patent: Aug. 1, 2006

(54) HARMONIC MIXER

(75) Inventors: Wolfram Kluge, Dresden (DE);
Dietmar Eggert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 826 days.

(21) Appl. No.: 09/904,751

(22) Filed: Jul. 13, 2001

(51) Int. Cl.
*H04B 1/26* (2006.01)
*H04B 1/10* (2006.01)
*H04L 27/06* (2006.01)
*H03D 1/00* (2006.01)

(52) U.S. Cl. .................. 455/323; 455/302; 455/326; 375/340

(58) Field of Classification Search ............ 375/340; 455/302, 326, 323
See application file for complete search history.

(56) References Cited

U.S. PATENT DOCUMENTS

| | | | |
|---|---|---|---|
| 5,020,148 A * | 5/1991 | Bonato ................. | 455/302 |
| 5,303,417 A | 4/1994 | Laws .................... | 455/314 |
| 5,448,772 A | 9/1995 | Grandfield ............. | 455/333 |
| 5,465,415 A * | 11/1995 | Bien .................... | 455/326 |
| 5,787,126 A * | 7/1998 | Itoh et al. ............. | 375/340 |
| 5,847,623 A | 12/1998 | Hadjichristos ......... | 332/105 |
| 5,999,804 A | 12/1999 | Forgues ................. | 455/333 |
| 6,144,846 A | 11/2000 | Durec .................... | 455/323 |
| 6,370,372 B1 * | 4/2002 | Molnar et al. ......... | 455/323 |

FOREIGN PATENT DOCUMENTS

GB          2 192 104 A      12/1987

* cited by examiner

*Primary Examiner*—Wing Chan
*Assistant Examiner*—Thjuan P. Knowlin
(74) *Attorney, Agent, or Firm*—Williams, Morgan & Amerson

(57) ABSTRACT

The invention provides a harmonic direct conversion mixer having a multiplier circuit comprising first and second mixers and a generator for generating two first and two second control signals for controlling the first and second mixers. The control signals are balanced signals and are provided in four phases shifted by $\pi/2$ in phase. The frequency of the control signals is different from the frequency of the mixer input signal.

12 Claims, 8 Drawing Sheets

HARMONIC MIXER

BACKGROUND OF THE INVENTION

1. Field of the Invention

This invention relates generally to transceivers, and, more particularly, to a harmonic mixer useful in an integrated radio frequency transceiver.

2. Description of the Related Art

The increasing demand for portable wireless communication devices having low price, weight and size and improved capabilities is prompting research in new IC (integrated circuit) technologies, circuit configurations and transceiver architectures. Transceiver implementations for wide band systems comprising direct conversion mixers are known and meet the above mentioned requirements better than architectures based on the widely used super-heterodyne principle.

At the transmitter stage of the transceiver, direct conversion mixers are used to up-convert a baseband analog or digital signal to a RF (radio frequency) signal for ease of transmission. At the receiver stage, direct conversion mixers are used to down-convert a received RF signal to baseband for ease of signal processing. Therefore, no high-Q filters and high-Q image rejection filters are necessary for image rejection and IF (intermediate frequency) filtering. Generally, it is difficult to integrate high-Q filters. Such receivers are also called zero-IF receivers, since the wanted signal is directly down-converted to the baseband and the IF is chosen to be zero. The mixers used therein commutate the amplified RF signal with the LO (local oscillator) signal. For example, in the often-used bipolar mixer based on the Gilbert analog multiplier, a current-mode commutation is performed.

For such direct conversion topologies, several problems like carrier leakage, second order intermodulation, and interference between local oscillator and RF signals exist.

Especially direct conversion receivers require a high degree of linearity of the mixer stage, since second order spurious products fall directly into the obtained baseband frequency and disturb the desired signal. The main reason for such second order mixer non-linearity is based on signal cross talk between the input signals of the mixer. Generally, this will lead to signal self-mixing effects causing DC (direct current) offset. However, this DC offset is not constant.

Further problems in state of the art transceiver architectures are pulling effects. In principal, such effects can be prevented by isolating the VCO (Voltage Controlled Oscillator) generating the LO signal from all other signals. However, isolation is a problem for architectures where the VCO is operating at the transmit frequency, i.e., FM (frequency modulation) systems using direct modulation of the VCO or a direct up-conversion principle. In such transceiver architectures, the power amplifier (PA) or a power pre-amplifier generates strong signals on the chip at the same frequency the on-chip VCO is operating at. The same problem occurs if strong signals are applied to the Rx (receive) input. VCO pulling is caused by non-perfect isolation, i.e., in transceiver topologies where the VCO is running at the same frequency as the Tx (transmit) output and the Rx input are operated. In modern transceiver architectures it is desirable to reduce such effects.

In state of the art receivers, the incoming RF signal is multiplied by a sinusoid signal derived from a local oscillator (LO signal). Both signals may be represented by a voltage or a current. The mixer performing the multiplication of both signals comprises two inputs that are practically not completely decoupled. Therefore, in addition to the wanted signal, each mixer input signal additionally contains a smaller cross-coupled portion of the other signal. Due to the multiplying property of the mixer, the output signal contains spurious signals, which are proportional to the power of the received signal centered around DC. These spurious signals are especially disadvantageous for the direct conversion principle, since the desired down-converted RF signal is also centered at a frequency of f=0.

The present invention solves, or at least reduces, some or all of the aforementioned problems.

SUMMARY OF THE INVENTION

The present invention provides a harmonic mixer comprising a multiplier circuit having first and second mixers and a generator for generating two first and two second control signals for controlling the first and second mixers, wherein the control signals are balanced signals and are provided in four phases shifted by $\pi/2$ in phase, and the frequency of the control signals is different from the frequency of the mixer input signal.

In one embodiment of the invention, the multiplier circuit is a Gilbert cell, i.e., a cross-coupled differential amplifier, where all transistors are used as switches and the control signal generating means comprise a VCO.

In another embodiment of the invention, the frequency of the control signals is half the frequency of the mixer input signal.

In another embodiment of the invention, the first mixer comprises a pair of field effect transistors and the second mixer comprises two pairs of field effect transistors.

The present invention further provides a harmonic mixer for I/Q quadrature phase modulation comprising a first multiplier circuit having first and second mixers for generating inphase (I) components, a second multiplier circuit having third and fourth mixers for generating quadrature (Q) components and a generator for generating two first and two second control signals for controlling the first and second mixers and two third and fourth control signals for controlling the third and fourth mixers, wherein said first, second, third and fourth control signals are balanced signals, a phase shift of $\pi/2$ between the first and second control signals is provided, a phase shift of $\pi/2$ between the third and fourth control signals is provided, a phase shift of $\pi/4$ between the first and second control signals and the third and fourth control signals is provided, and the frequency of the control signals is half the frequency of the mixer input signal.

In one embodiment of the invention, the first and second multiplier circuits comprise a Gilbert cell, where all transistors are used as switches and the control signal generator comprises a VCO and a filter bank.

In another embodiment of the invention, the frequency of the control signals is half the frequency of the mixer input signal.

In a further embodiment of the invention, the first and third mixers comprise a pair of field effect transistors and the second and fourth mixers comprise two pairs of field effect transistors.

In another embodiment of the invention, the filter bank comprises an initial $\pi/4$ phase shifter and two polyphase filters for generating the eight control signals, and the $\pi/4$ phase shifter has two all-pass filters providing two differential signals shifted by $\pi/4$.

The inventive receiver utilizes a VCO oscillator operating at half the frequency of the received RF signal. Although, the control signals are preferably generated by means of a VCO, the present invention is not limited to a topology comprising a VCO. The control signals may also be generated by other devices known in the art. The VCO is generating two balanced signals having the same frequency, which are shifted by 90 degrees in phase. According to the invention, these two signals are essentially multiplied with each other, whereby a spectral component at twice the frequency of the balanced signal is created. This component can be used to convert the desired signal into the desired frequency range. Because of this general approach, the inventive principle can be used for a large variety of mixers, e.g., for mixers in direct conversion receivers or for mixers in direct conversion transmitters.

Principally, the following mathematical relations are used. Consider two signals $u_{VCO1}=u_1 \cos \omega_1 t$ and $u_{VCO2}=u_2 \cos \omega_1 t+\phi$. These signals $u_{VCO2}$ and $u_{VCO1}$ are shifted by an angle of $\phi$ degrees. If both signals are multiplied, the following signal $u_{MIX}=G_{MIX} \cdot u_{VCO1} \cdot u_{VCO2}$ can be derived, wherein $G_{MIX}$ is an amplification factor:

$$u_{MIX} = G_{MIX} u_1 \cos(\omega_1 t) \cdot u_2 \cos(\omega_1 t + \varphi) \quad (1)$$
$$= \frac{1}{2} G_{MIX} u_1 u_2 (\cos\varphi + \cos(2\omega_1 t + \varphi))$$

As can be seen from (1), for a phase shift of $\phi=90$ degrees between the two VCO signals, the DC component gets cancelled. This simplifies the circuit design.

Using real analogue multiplier would allow the use of sinusoidal signals, and therefore, the direct implementation of inphase (I) and quadrature (Q) signals by implementing the following functions:

$$I_{MIX} = u_{MIX} \cos\omega_1 t \cdot \sin\omega_1 t = \frac{1}{2}\sin 2\omega_1 t \quad (2)$$

$$Q_{MIX} = \frac{u_{MIX}}{2} \cos^2\omega_1 t - \sin^2\omega_1 t = \frac{1}{2}\cos 2\omega_1 t \quad (3)$$

These two dependencies are required in modern transceiver architectures for digital modulation schemes taking advantage of the complex behavior of signals. However, due to bad noise performance, such an analogue implementation is rather seldom used compared to a switching realization as it is used in the present invention.

The present invention solves an inherent problem of mixer realization for direct up- and down-conversion architectures, whereby no other implementation leads to such performance with respect to linearity and suppression of LO signals. Furthermore, from a system architecture point of view, the hardness of the VCO signals in relation to the signals coming from the power amplifier is reasonably improved.

BRIEF DESCRIPTION OF THE DRAWINGS

The invention may be understood by reference to the following description taken in conjunction with the accompanying drawings, in which like reference numerals identify like elements, and in which.

Figure 1:
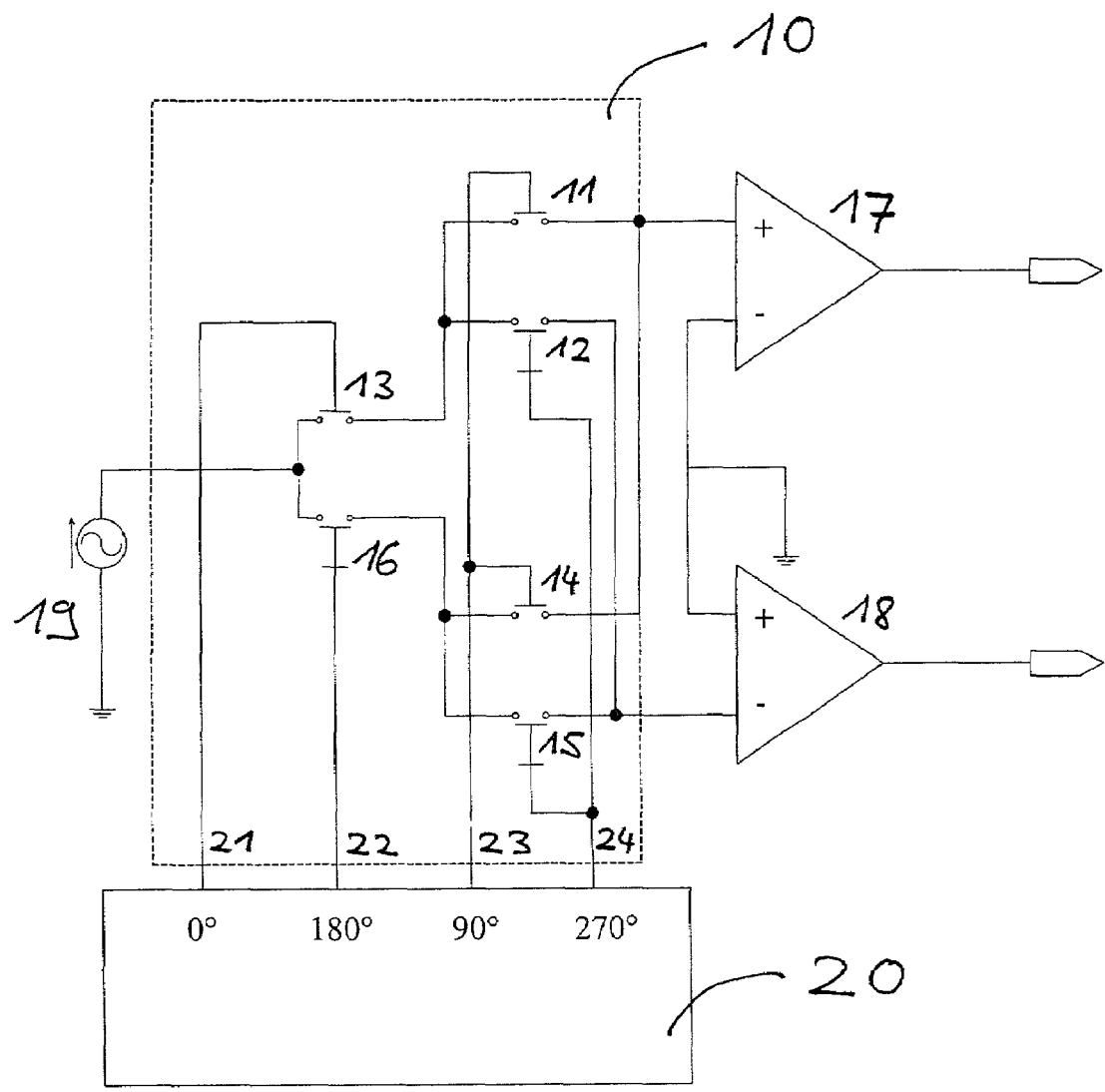
FIG. 1 is a circuit diagram of a mixer according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

Referring now to FIG. 1, a schematic circuit diagram of a preferred embodiment of the direct conversion mixer according to the present invention is illustrated. As shown in FIG. 1, the circuit comprises a switching network 10, a control signal generating means 20 and two output operational amplifiers 17, 18. The control signal generating means 20 may be a VCO. The input signal 19 is an RF signal. The switching topology shown is a Gilbert cell providing a balanced architecture for the four control signals 21, 22, 23 and 24. In the following, the term Gilbert cell is used for a Gilbert cell-like switching topology, where all transistors are used as switches. As shown in FIG. 1, the Gilbert cell mixer comprises a first mixing stage comprising two field-effect transistors (FETs) 13 and 16 and a second mixing stage comprising four FETs 11, 12, 14 and 15. More particularly, the Gilbert cell includes two field-effect transistors (FET) 11 and 12 whose sources are connected to FET 13, and two FETs 14, 15 whose sources are connected to FET 16. LO signals are applied to all gates of the FETs. The LO signals 21 and 22 applied to the gates of FETs 13 and 16 are balanced signals. Similarly, the LO signals 23 and 24 applied to the gates of FETs 11, 12 and 14, 15 are balanced signals. It has to be noted that signal 23 is applied to the gates of FETs 11 and 14 and signal 24 is applied to the gates of FETs 12 and 15. Additionally, as can be seen from FIG. 1, the LO signals applied to the FET gates of mixing stage one and the LO signals applied to the FET gates of mixing stage two are shifted by 90 degrees in phase. All LO signals have the same frequency, however, the frequency is half the frequency of the input signal 19 and the LO signals are shifted by 90 degrees in phase. FET 14 has a drain connected to the drain of FET 11, which is connected to the positive input of output amplifier 17. Similarly, FET 12 has a drain connected to the drain of FET 15, which is connected to the negative input of the output amplifier 18. The negative input of the operational amplifier 17 and the positive input of the operational amplifier 18 are connected and coupled to ground. The output signals of the Gilbert cell are detected by these fully differential operational amplifiers 17, 18 suppressing the RF in the further signal path by their CMRR (common mode rejection ratio). Although, only a FET realization is shown, depending on the technology being used, the switches may also be bipolar transistors.

Figure 2:
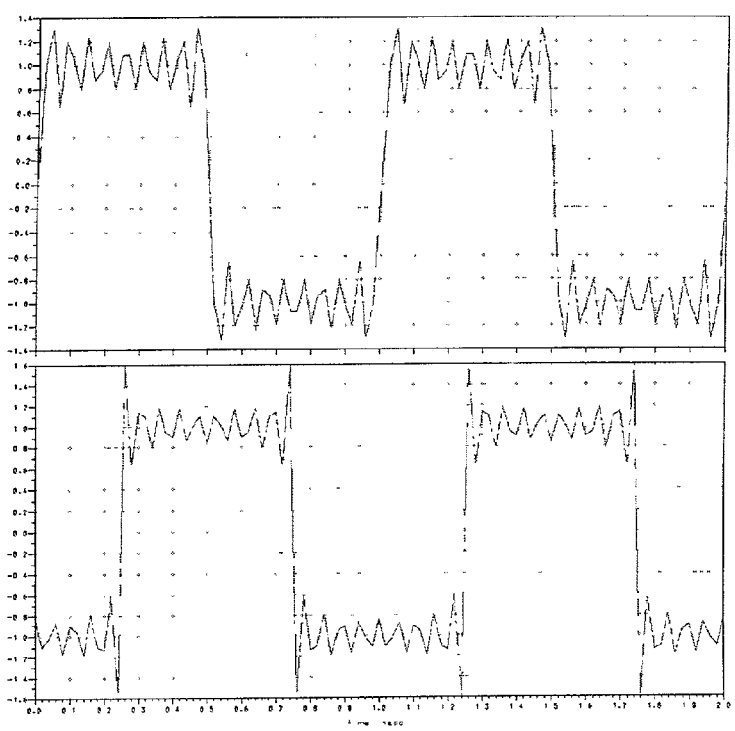
FIG. 2 is a diagram of the control voltages applied to the first and second switching means.

Referring now to FIG. 2, a diagram of two of the four signals, which are applied to the first and second switching means is shown. All signals have the same shape (the ringing is caused by the harmonic balance simulator in use), but are shifted by 90 degrees in phase. As the low time equals the high time, no even order harmonics are comprehended in these signals.

Figure 3:
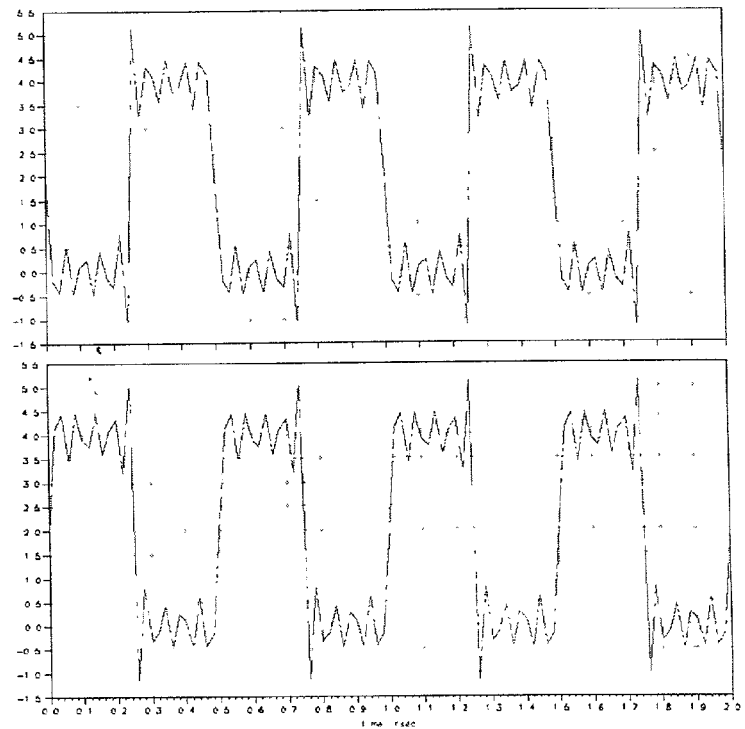
FIG. 3 is a diagram of the conductance characteristic of the mixer output.

Referring now to FIG. 3, a diagram of the conductance characteristic of the mixer output is shown. Therein, a spectral component at twice the frequency of the VCO signal dominates the spectrum characteristic. This will be used to convert the incoming RF signal. It is inherent in the inventive architecture that neither the VCO signal itself or its derived components at the double frequency nor the incoming RF signal will appear at the output in differential mode. The circuit according to this invention operates in voltage mode. Therefore, smaller switch transistors, a low impedance RF source and high input impedance of the operational amplifier are required. In current mode, larger switches, a higher impedance RF source and a low input impedance operational amplifier are required.

Modern transceiver architectures require complex signal processing. Therefore, a signal path for an inphase component (I) and for a quadrature phase component (Q) has to be provided. Hence, another four signals with a phase shift of 45 degrees relative to the first signals have to be provided. Since this 45 degree phase shift leads to a 90 degree phase shift between both paths in the present receiver implementation, the requirements of the architecture are fulfilled.

Figure 4:
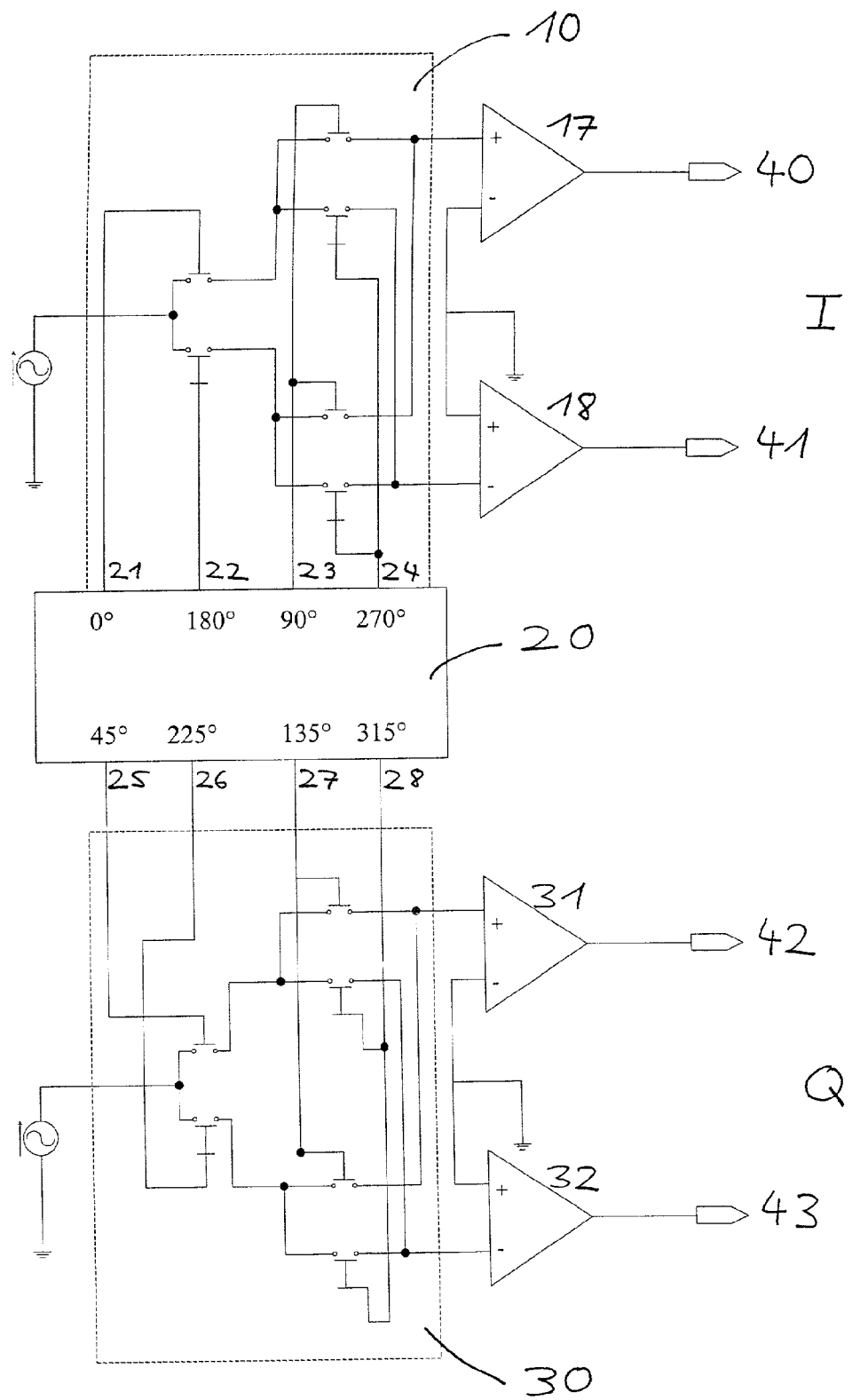
FIG. 4 is a circuit diagram of an I/Q quadrature phase implementation of a mixer according to the present invention.

FIG. 4 shows a circuit diagram of such an I/Q quadrature phase implementation of a mixer. This I/Q path realization includes a first Gilbert cell circuit 10 providing I-signals 40 and 41, a second Gilbert cell circuit 30 providing Q-signals 42 and 43, four output operational amplifiers 17, 18, 31 and 32, and means for generating control signals 20. The Gilbert cell circuits 10 and 30 are equivalent to the Gilbert cell circuit of FIG. 1. It is therefore referred to the corresponding explanation. The means for generating control signals 20 may comprise a VCO and preferably a filter bank. They provide four control signals 21, 22, 23 and 24 for the first Gilbert cell mixer and four control signals 25, 26, 27 and 28 for the second Gilbert cell mixer. The signals 21 and 22, 23 and 24, 25 and 26, 27 and 28 are in each case balanced. Hence, four control signals for the first Gilbert cell shifted by 90 degrees in phase and four control signals for the second Gilbert cell shifted by 90 degrees in phase are provided. Additionally, the control signals of the second Gilbert cell are shifted by 45 degrees relative to the control signals of the first Gilbert cell. All control signals have the same frequency, however, the control signal and VCO operation frequency is preferably half the frequency of the input signals. The operational amplifiers 17 and 18 provide the I+ 17 and I− 18 signals and the operational amplifiers 31 and 32 provide the Q+ 31 and Q− 32 signals. Although, a FET realization is shown in FIG. 4, the switches may also be bipolar technology.

The eight different control signals may be provided by a filter bank deploying all-pass filters and 90 degree polyphase filters. However, other implementations are possible.

Figure 5:
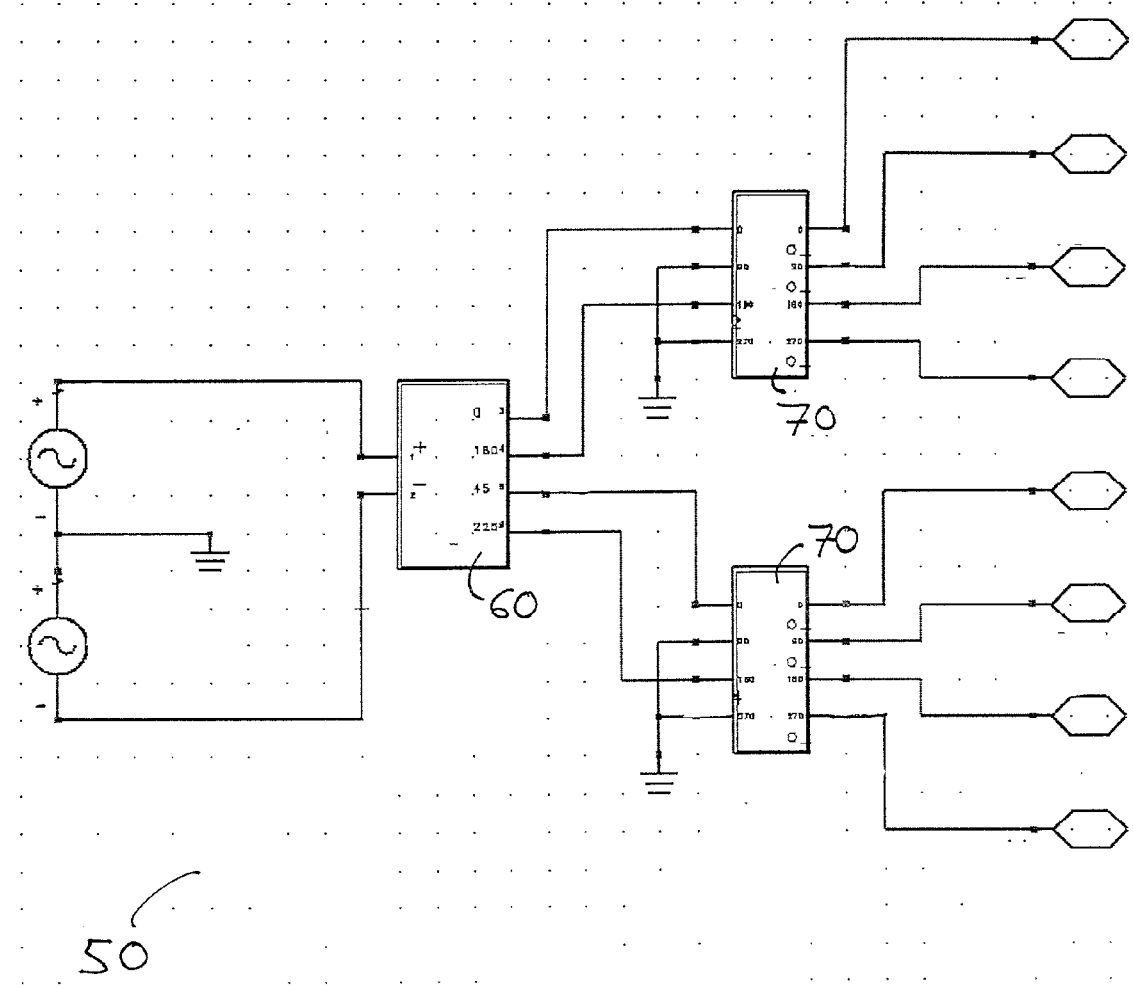
FIG. 5 is a circuit diagram of a filter bank according to the present invention for providing the control signals each shifted by 45 degrees in phase.

In FIG. 5, a filter bank implementation 50 according to the present invention is shown. Therein, the initial signals are applied to a 45 degree phase shifter 60 providing two differential signals, which are shifted by 45 degrees. Subsequently, the 90 degree polyphase filters 70 generate the desired eight signals.

Figure 6:
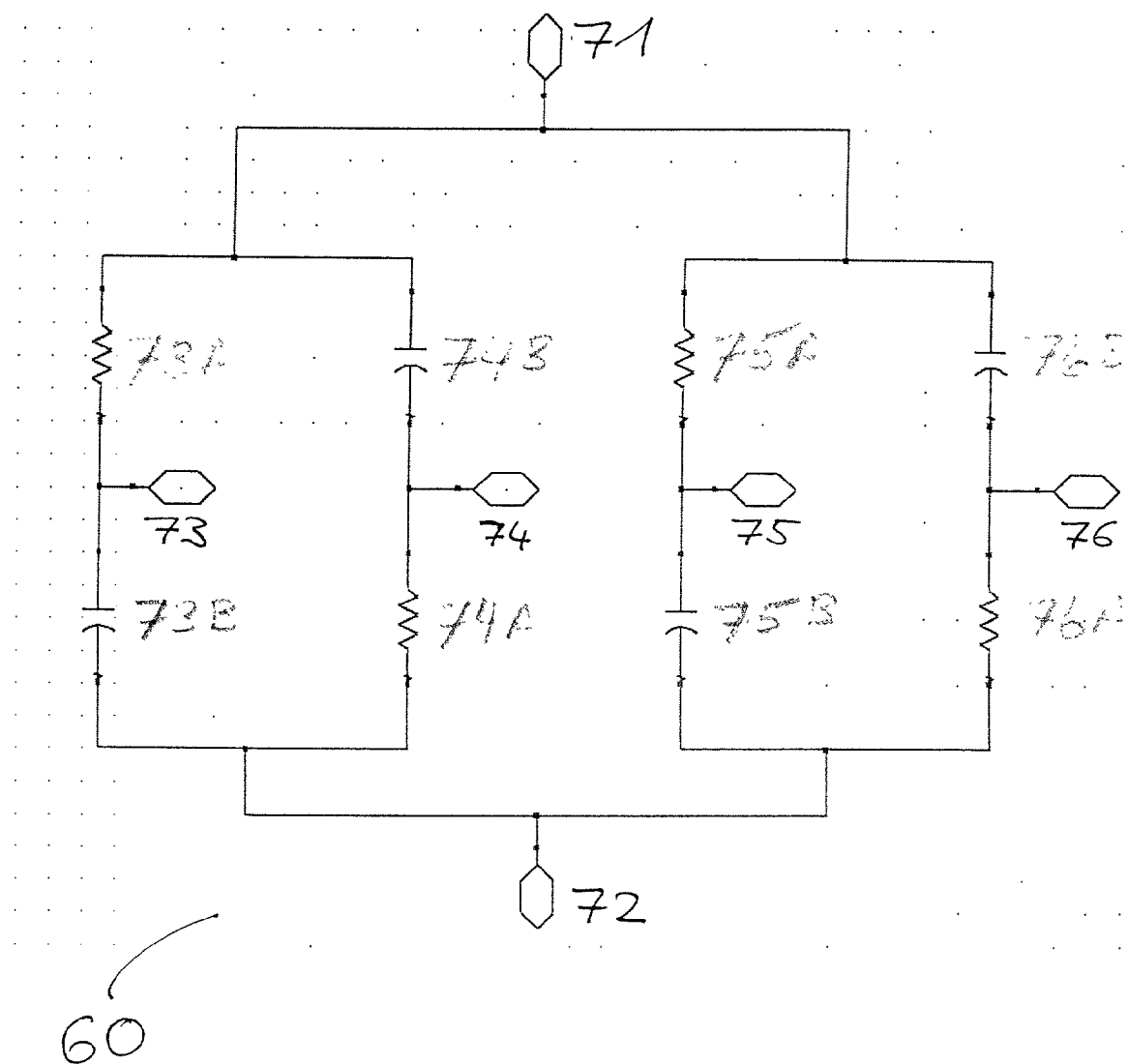
FIG. 6 is a circuit diagram of two all-pass filters according to the present invention providing initial 45 degrees phase shift.

Referring now to FIG. 6, one possible structure of the 45 degree phase shifter 60 is depicted. The phase shifter 60 comprises two all-pass filters detuned to result in a 45 degree phase difference between the outgoing signals. The input terminals are indicated by reference numbers 71, 72 and the output terminals are indicated by reference numbers 73, 74, 75 and 76.

Figure 7:
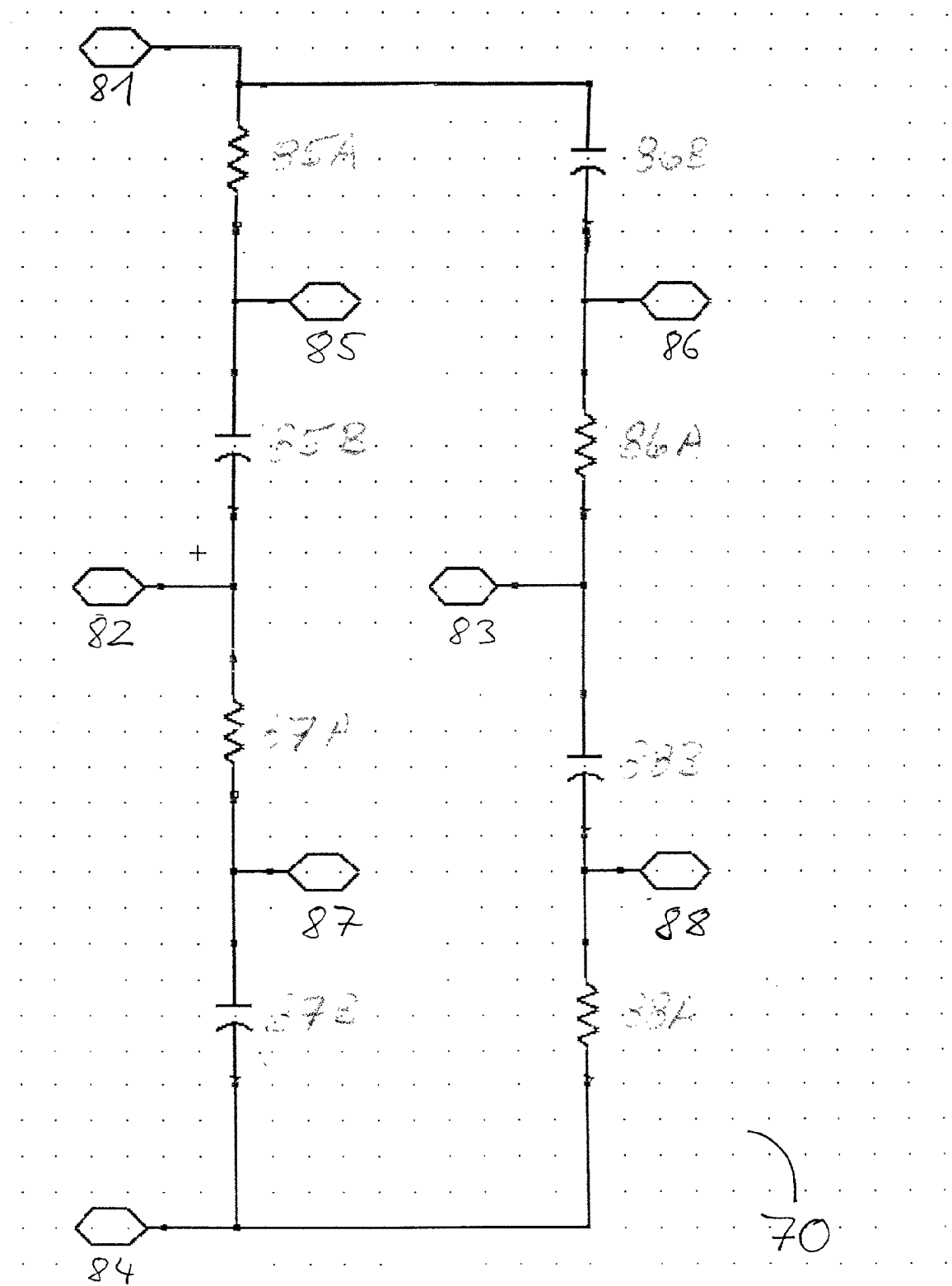
FIG. 7 is a circuit diagram of a polyphase filter according to the present invention providing four signals shifted by 90 degrees relative to each other.

One implementation of the 90 degree polyphase filter 70 of FIG. 5 is depicted in FIG. 7. The input terminals are indicated by reference numbers 81, 82, 83 and 84 and the output terminals are indicated by reference numbers 85, 86, 87 and 88.

Figure 8:
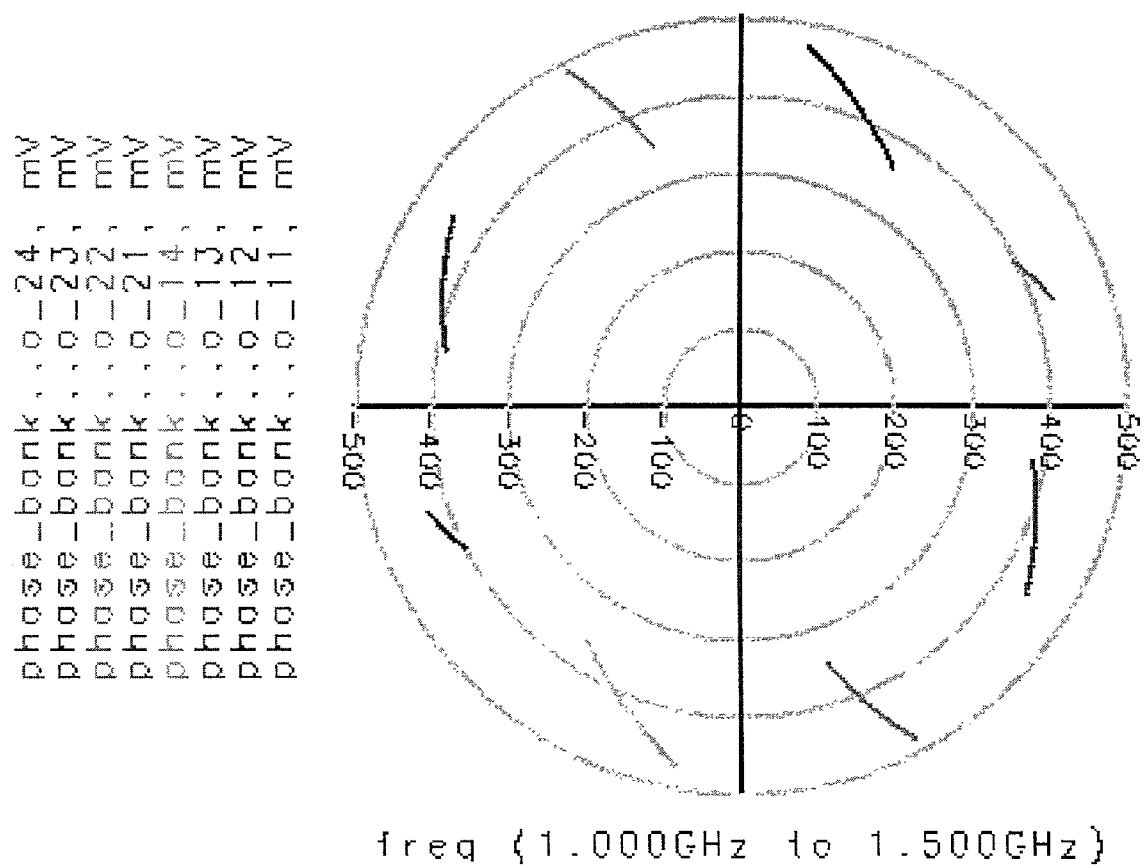
FIG. 8 is a phase plot of the filter bank output signals.

The particular values for the resistors and capacitors in the circuits depicted in FIGS. 6 and 7 will be selected as a function of the desired target frequency of operation. Those of ordinary skill in the art will easily be able to select appropriate values for the resistors and capacitors for any desired frequency of operation. For example, in one illustrative embodiment of the circuits of FIGS. 6 and 7, for a target frequency of operation of 1.2 GHz, the following values may be used:

Resistors 73A, 74A, 75A, 76A=0.6 e+3 ohms
Resistors 85A, 86A, 87A, 88A=1.0 e+3 ohms
Capacitors 73B, 74B=126 e−15 farads
Capacitors 75B, 76B=4.0 e−15 farads
Capacitors 85B, 86B, 87B, 88B=130 e−15 farads Referring now to FIG. 8, a phase plot of the eight filter bank output signals having a 45 degree phase shift and a reasonable amplitude balance is shown.

Figure 9:
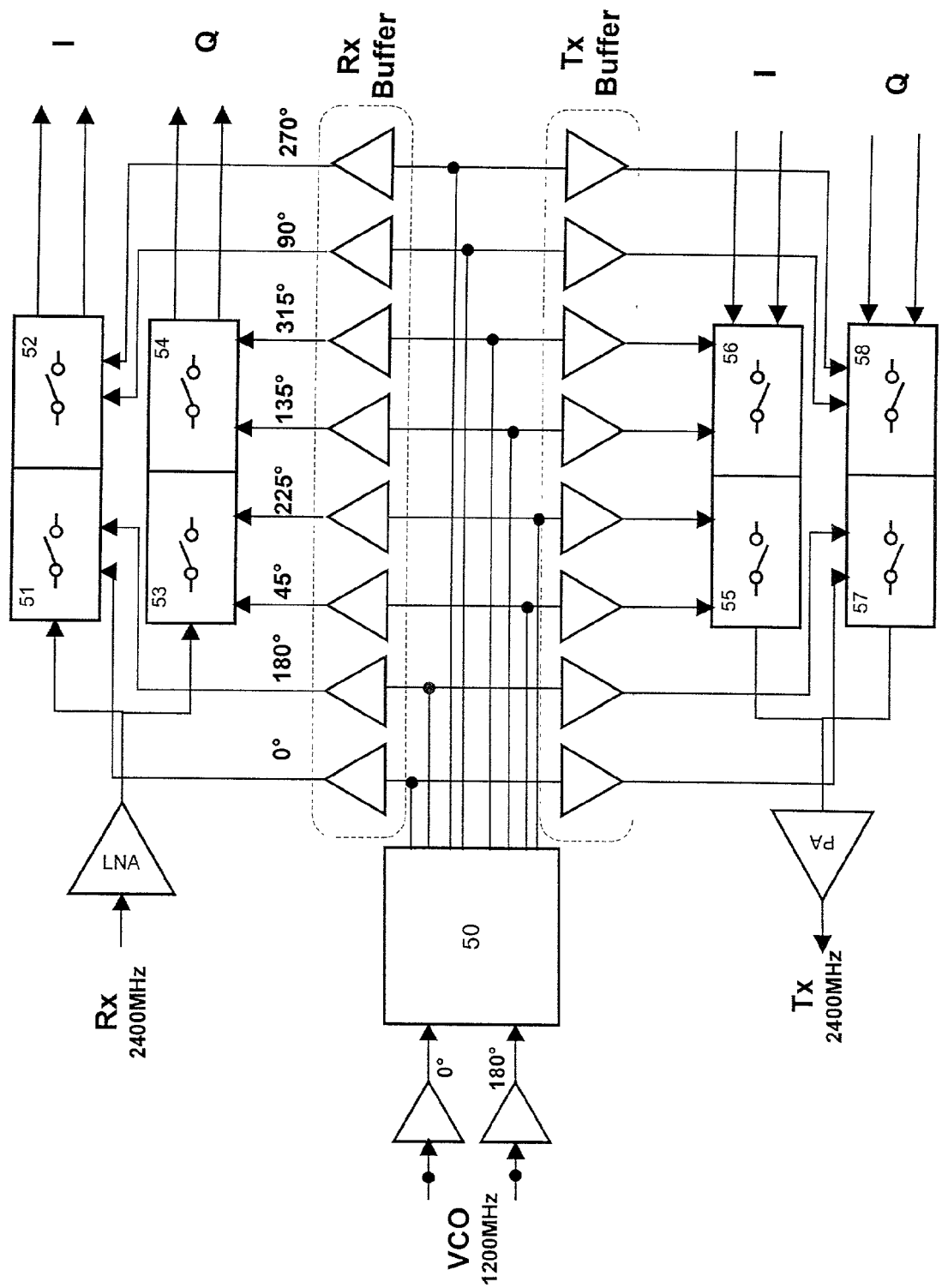
FIG. 9 is a block diagram of a RF front-end with I/Q signal generation for a 1200 MHz/1200 MHz frequency ratio according to the present invention.

Referring now to FIG. 9, a block diagram of an RF front-end realization with I/Q signal generation for a 1200 MHz/1200 MHz frequency ratio according to the present invention is illustrated. The RF front-end comprises a receiver section, a transmitter section and a control signal generation section. The receiver section comprises a receiver input Rx receiving a 2400 MHz signal, a Rx Buffer, four switching means 51, 52, 53 and 54 and receiver outputs providing the I- and Q-signals. The respective phase shifts of the switching means control signals are indicated in FIG. 9.

The control signal generation section has a filter bank 50. Two balanced 1200 MHz VCO signals are applied to the filter bank. The transmitter section comprises a transmitter output Tx transmitting a 2400 MHz signal, a Tx Buffer, four switching means 55, 56, 57 and 58 and transmitter inputs receiving the I- and Q-data.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A harmonic mixer comprising:
    a multiplier circuit comprising first and second mixers; and
    a generator for generating two first and two second control signals for controlling said first and second mixers,
    wherein said two first and two second control signals are balanced signals and are provided in four phases each shifted by $\pi/2$ in phase, and
    said control signals having a frequency different from a frequency of a mixer input signal.

2. The harmonic mixer of claim 1, wherein said multiplier circuit is a Gilbert cell having a plurality of transistors, where all said transistors are used as switches.

3. The harmonic mixer of claim 1, wherein said generator comprises a voltage controlled oscillator.

4. The harmonic mixer of claim 1, wherein the frequency of said control signals is half the frequency of the mixer input signal.

5. The harmonic mixer of claim 1, wherein said first mixer has a pair of field effect transistors and said second mixer has two pairs of field effect transistors.

6. A harmonic direct conversion mixer for I/Q quadrature phase modulation, comprising:
    a first multiplier circuit comprising first and second mixers for generating inphase (I) components;
    a second multiplier circuit comprising third and fourth mixers for generating quadrature (Q) components; and
    a generator for generating two first and two second control signals for controlling said first and second mixer and two third and two fourth control signals for controlling said third and fourth mixer,
    wherein said two first, two second, two third and two fourth control signals are balanced signals,
    a phase shift of $\pi/2$ between said two first and two second control signals is provided,
    a phase shift of $\pi/2$ between said two third and two fourth control signals is provided,
    a phase shift of $\pi/4$ between said two first and two second control signals and said two third and two fourth control signals is provided, and
    said control signals having a frequency different from a frequency of a mixer input signal.

7. The harmonic mixer of claim 6, wherein said first and second multiplier circuits each comprise a Gilbert cell having a plurality of transistors, where all said transistors are used as switches.

8. The harmonic mixer of claim 6, wherein said generator comprises a voltage controlled oscillator and a filter bank.

9. The harmonic mixer of claim 6, wherein the frequency of said control signals is half the frequency of the mixer input signal.

10. The harmonic mixer of claim 6, wherein said first and third mixers each comprise a pair of field effect transistors and said second and fourth mixers each comprise two pairs of field effect transistors.

11. The harmonic mixer of claim 8, wherein said filter bank comprises:
    an initial $\pi/4$ phase shifter; and
    first and second polyphase filters for generating said eight control signals.

12. The harmonic mixer of claim 11, wherein said $\pi/4$ phase shifter has first and second all-pass filters providing first and second differential signals shifted by $\pi/4$.

* * * * *